(12) United States Patent
Schmitt et al.

(10) Patent No.: US 8,056,504 B2
(45) Date of Patent: Nov. 15, 2011

(54) VOLTAGE NON-UNIFORMITY COMPENSATION METHOD FOR HIGH FREQUENCY PLASMA REACTOR FOR THE TREATMENT OF RECTANGULAR LARGE AREA SUBSTRATES

(75) Inventors: Jacques Schmitt, Ville du Bois (FR); Laurent Sansonnens, Concise (CH); Mustapha Elyaakoubi, Ris-organis (FR); Michael Irzyk, Champlan (FR)

(73) Assignee: Oerlikon Solar AG, Trubbach, Trubbach (CH)

( * ) Notice: Subject to any disclaimer, the term of this patent is extended or adjusted under 35 U.S.C. 154(b) by 0 days.

(21) Appl. No.: 12/708,757

(22) Filed: Feb. 19, 2010

(65) Prior Publication Data

US 2010/0139863 A1    Jun. 10, 2010

Related U.S. Application Data

(63) Continuation of application No. 12/346,917, filed on Dec. 31, 2008, now Pat. No. 7,687,117, which is a continuation of application No. 10/935,779, filed on Sep. 8, 2004, now Pat. No. 7,487,740.

(60) Provisional application No. 60/543,955, filed on Feb. 12, 2004, provisional application No. 60/501,772, filed on Sep. 10, 2003.

(51) Int. Cl.
*H01L 21/00* (2006.01)
*C23C 16/00* (2006.01)
(52) U.S. Cl. ........... 118/723 E; 156/345.43; 156/345.47
(58) Field of Classification Search ............... 118/723 E; 156/345.43, 345.44, 345.45, 345.46, 345.47
See application file for complete search history.

(56) References Cited

U.S. PATENT DOCUMENTS

| | | | |
|---|---|---|---|
| 4,342,901 A | 8/1982 | Zajac | |
| 4,885,074 A | 12/1989 | Susko et al. | |
| 5,203,980 A | 4/1993 | Cremer et al. | |
| 5,292,394 A * | 3/1994 | Cord et al. | 204/298.39 |
| 5,628,869 A | 5/1997 | Mallon | |
| 5,695,566 A * | 12/1997 | Suzuki et al. | 118/723 E |
| 5,718,769 A | 2/1998 | Hashizume et al. | |
| 5,820,947 A | 10/1998 | Itoh | |
| 5,904,487 A | 5/1999 | Conboy et al. | |
| 5,938,854 A | 8/1999 | Roth | |
| 5,997,686 A * | 12/1999 | Lardon et al. | 156/345.38 |
| 6,183,565 B1 * | 2/2001 | Granneman et al. | 118/725 |
| 6,228,438 B1 | 5/2001 | Schmitt | |
| 6,294,227 B1 | 9/2001 | Anma et al. | |
| 6,631,692 B1 | 10/2003 | Matsuki et al. | |
| 2001/0022996 A1 | 9/2001 | Yajima et al. | |
| 2002/0129902 A1 | 9/2002 | Babayan et al. | |
| 2003/0089314 A1 | 5/2003 | Matsuki et al. | |
| 2005/0241583 A1 * | 11/2005 | Buechel et al. | 118/723 E |

FOREIGN PATENT DOCUMENTS

DE    10134513 A1    1/2003

* cited by examiner

*Primary Examiner* — Ram Kackar
*Assistant Examiner* — Anna Crowell
(74) *Attorney, Agent, or Firm* — Pearne & Gordon LLP

(57) ABSTRACT

A vacuum vessel and at least two electrodes define an internal process space. At least one power supply is connectable with the electrodes. A substrate holder holds a substrate to be treated in the internal process space. At least one of the electrodes has along a first cross section a concave profile and has along a second cross section a convex profile, the first cross section being parallel to the second cross section. Gas is provided to the space through a gas inlet. Power is provided to the electrodes and the substrate is treated.

12 Claims, 10 Drawing Sheets

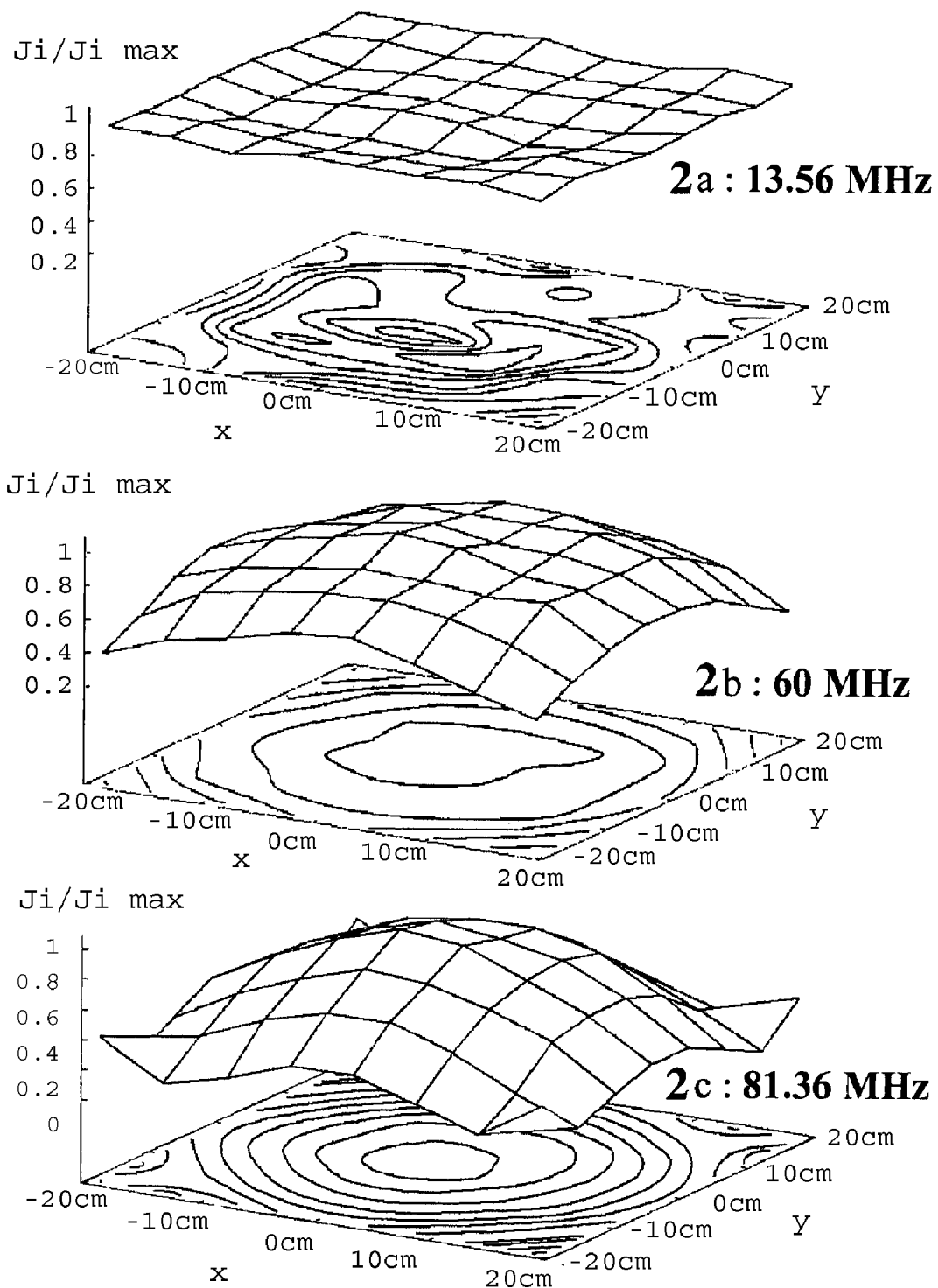
Figures 2 a, 2 b, and 2c

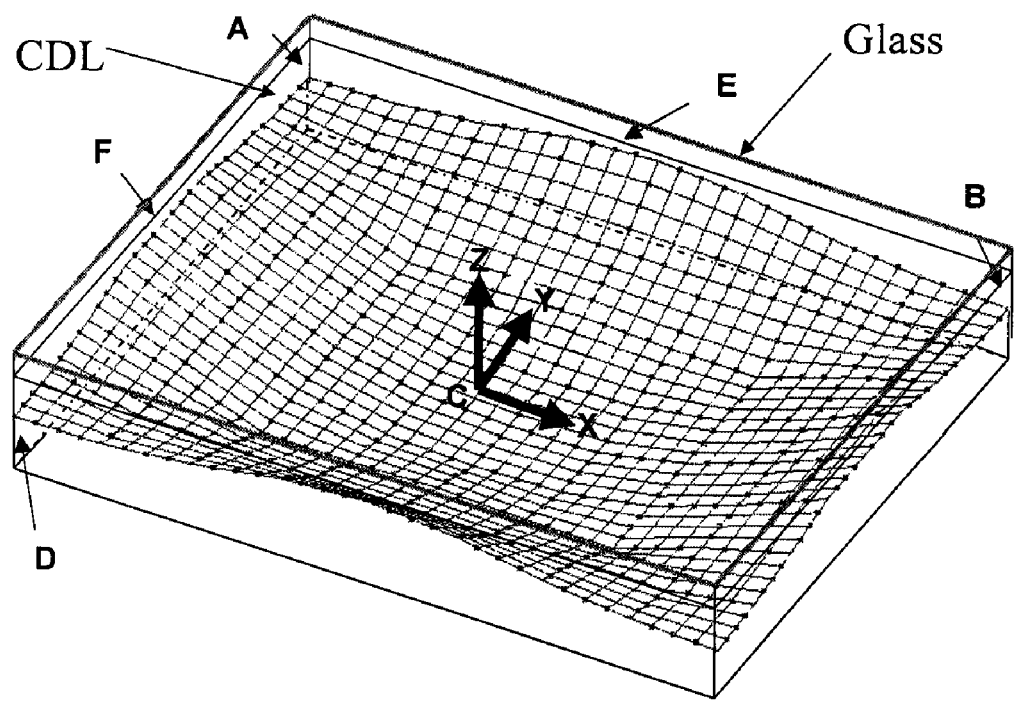
Figure 3-a

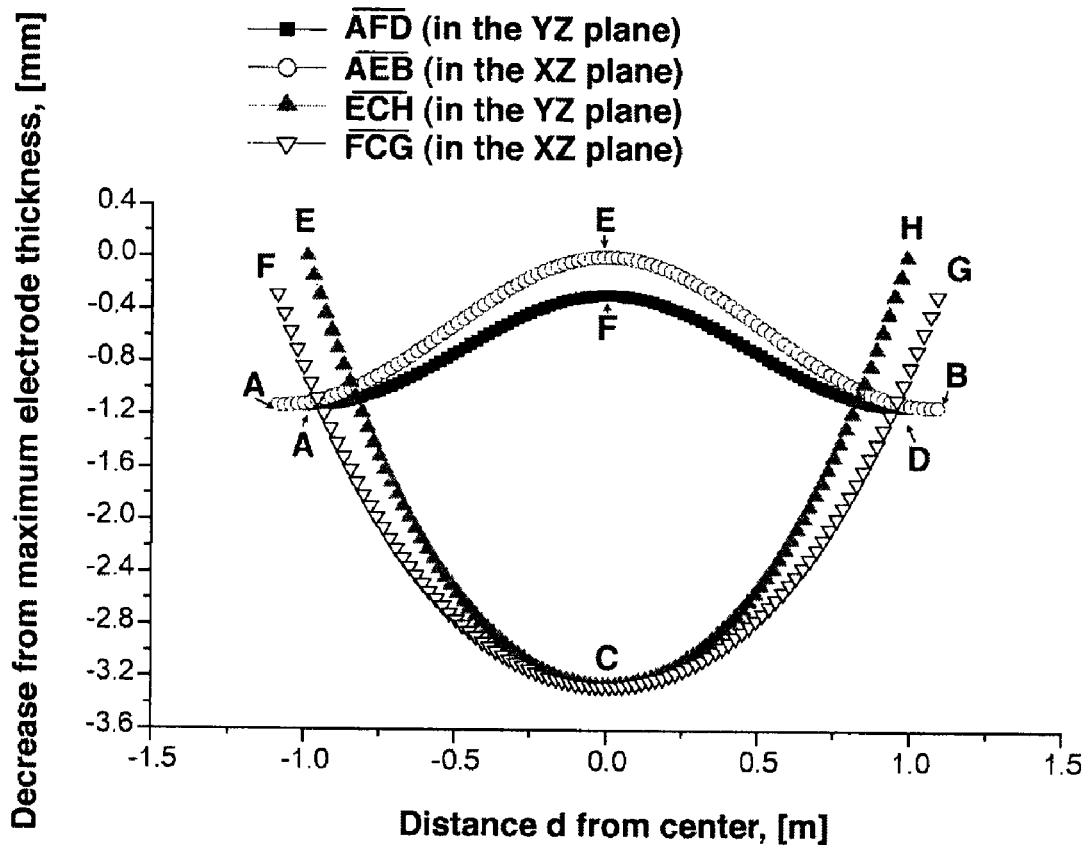
Figure 3-c

VOLTAGE NON-UNIFORMITY COMPENSATION METHOD FOR HIGH FREQUENCY PLASMA REACTOR FOR THE TREATMENT OF RECTANGULAR LARGE AREA SUBSTRATES

TECHNICAL FIELD OF THE INVENTION

This invention relates to a voltage and electrical field non-uniformity compensation method for large area and/or high frequency plasma reactors. This method is generally applicable to rectangular (or square) large area plasma processing equipment, which is used in—but not limited to—LCD, Plasma Display and Solar Cell production) or any other reactor using electromagnetic waves (RF, VHF) for processing.

BACKGROUND OF THE INVENTION

The standard frequency of the radio frequency generators mostly used in the industry today is 13.56 MHz. This frequency is open for industrial use by international telecommunication regulations. However, lower and higher frequencies were discussed and desired from the pioneering days of plasma capacitor applications. Nowadays, namely in PECVD applications, (plasma enhanced chemical vapor deposition applications), there is a trend to change to RF frequency values higher than 13.56 MHz, the preferred values being 27.12 MHz and 40.68 MHz (harmonics of 13.56 MHz). Higher frequencies allow for higher deposition rates in PECVD processes and thus increase productivity and lower product costs. Accordingly, this invention applies to RF frequencies in the range of 1 to 100 MHz, but it is mostly relevant to frequencies above 10 MHz. Furthermore, the invention can also be applied up to the microwave range of several GHz.

With large area plasma processing equipment, severe problems arise when the RF frequency is higher than 13.56 MHz and a large size (large surface) substrate is used. As described below, the problem addressed by this invention becomes of real importance when the largest dimension of the planar capacitive reactor (the diagonal) is equal or larger than 3-5% of the free space wavelength of the RF electric power driving the plasma. Under such circumstances, the reactor size is no longer negligible relative to the free space wavelength of the RF electromagnetic wave. In such a case, the plasma intensity along the reactor can no longer be uniform. Physically, the origin of such a limitation lies in the fact that the RF wave is distributed according to the beginning of a "standing wave" spatial oscillation within the reactor. Other non-uniformities can also occur in a reactor, for example non-uniformities induced by the reactive gas provided for the plasma process.

U.S. Pat. No. 6,228,438 of the same applicant (hereinafter US '438) describes different ways of solving the standing wave problem, which leads to voltage non-uniformity distribution over the reactor electrodes. U.S. Pat. No. 6,631,692 describes a plasma CVD film-forming device wherein both electrodes have a concave surface. According to U.S. Pat. No. 6,631,692, this leads to a more uniform plasma, but this document does not address the "standing wave problem" described below. US '438 focuses on the problem of an essentially cylindrically symmetric parallel plate reactor. No known prior art addresses the complex compensation necessary for the case of a square box shaped reactor with rectangular or square substrates and electrodes.

When a standing wave forms in the cavity, the voltage non-uniformity distribution can lead to plasma non-uniformity as the plasma is sustained in the reactor gap (between the cathode and the anode and above the substrate). This will lead to non-uniform processing and/or non-uniform properties of the layers on the substrate, depending on the desired application (deposition and etching for example). The present invention can also be applied to reactors, which do not necessarily use plasma: for example reactors using high frequency electromagnetic waves for heating.

To understand and to predict the standing wave problem, experiments have been conducted to determine the shape and the intensity of this non-uniformity and its dependency on the reactor scale (size) as well as the excitation frequency. US '438 teaches that the non-uniformity induced by standing waves depends very closely on the reactor size and the excitation frequency. Experiments were conducted in two types of reactors:

i) A large cylindrical reactor (with 1 m diameter) where non-uniformity due to standing waves is very pronounced at high frequencies (67.8 MHz and 100 MHz) was used for quantitative studies. FIG. 1-$a$ shows the measured and normalized plasma light intensity for two extreme Argon plasma conditions (pressure and RF power) across the reactor diameter. The plasma conditions in this experiment have been chosen such that all other plasma conditions would have lead to a light intensity distribution, which is between the red and green curves. In the absence of plasma, the electrical field can be calculated to be zero in a distance of 2400 mm from the central RF injection point. By igniting plasmas under different power and pressure conditions at 67.8 MHz, it can bee seen in FIG. 1-$a$, that near zero plasma density already occurs at around 450 mm distance from the reactor center. This dramatic decrease in uniformity in presence of the plasma is due to the reduction of the electromagnetic wavelength causing the standing wave compared to the vacuum calculation and is due to the effective permittivity of the plasma and sheath distribution in the inter-electrode gap. By further increasing the plasma excitation frequency to 100 MHz, it can be seen that the zero plasma light intensity zone has shifted from 400 mm in FIG. 1-$a$ to about 300 mm in FIG. 1-$b$.

ii) A small rectangular reactor (0.4 m×0.4 m) was used to measure the ion flux uniformity in Argon plasma. In FIGS. 2-$a$, 2-$b$, and 2-$c$, the plasma uniformity measured by ion flux uniformity in the plasma is shown. This ion flux uniformity is directly linked to electron and ion density uniformity. It should be noted that ion density and electron density uniformity of the plasma are, at a first order, the parameters, which are responsible for the plasma processing uniformity. From these figures it can be seen that the plasma is relatively uniform at 13.6 MHz and it becomes non-uniform when the excitation frequency is increased to 60 MHz and 81 MHz. This non-uniformity is due to the standing wave effect, which is more pronounced when excitation frequency is increased.

This experimental evidence shows that the plasma non-uniformity, which is due to standing waves, is dependant on excitation frequency and reactor size. I other words it is dependant on the scaling difference between the excitation wavelength and reactor typical dimension.

Known Problems for the Rectangular Case:

US '438 does not specifically refer to the standing wave problem in the case of a rectangular reactor and also in the case of very large reactor areas (>1 $m^2$ and more typically 3-4 $m^2$) where additional practical problems for RF injection points arise. When the reactor area increases, one needs to increase the number of injection points on the excited electrode (cathode) in order to distribute the RF current over several points and thus reduce the RF current density and thereby also reduce the failure risks due overheating and thermal impact such as melting, mechanical deformation, fatigue and others more.

For rectangular reactors, which are widely used in PECVD production—for such applications and equipment as TFT Displays, Plasma Displays, Solar Cells and others—the standing wave form which is created by electromagnetic propagation has a non-cylindrical symmetry shape (the solution still has symmetry along the two axes of the electrode) due to the strong effect of the reactor's corners or the electrode's corners respectively. In addition the waveform in the plasma region is dependant on the RF injection geometry, while this injection takes place in the backside of the electrode. Even if one uses only one RF injection point which is well positioned in the center of the back side of the reactor electrode, the effect of the corner due to the standing waves has to be taken into account. US '438 describes the shape of the compensating dielectric layer basically in cylindrical geometry with the thickness of the dielectric layer decreasing from the center towards the edges.

This method is strictly speaking optimized for cylindrical geometry reactors but cannot sufficiently compensate the non-uniformity when using a rectangular reactor.

SUMMARY OF THE INVENTION

US '438 teaches certain parameter ranges for the reactor size (electrode size) and/or the excitation frequency, as a "minimum level" (threshold), from which the standing wave starts to give substantial effect on the plasma processing. To quantify this level, one can use a value "r×f" given by the product of size [m] of the electrode and frequency [MHz], whereby "size" is being measured from the centre of the (rectangular or square) electrode to the farthest corner. In geometrical terms this represents the radius of an imaginary circle, which circumscribes the corners of one electrode.

As an example for a "minimum level", one can define the range of 2-4% deviation of plasma homogeneity. This plasma homogeneity is defined as the homogeneity of electron density or ion density over the reactor surface. In some cases, the electron and ion density is not easily measured locally; therefore plasma integrated light intensity (luminosity) is measured locally instead, because the light intensity is directly correlated to the electron density. Consequently, the homogeneity of the plasma luminosity is used as a way to measure the plasma homogeneity (FIGS. 2a and 2b). On the other hand it is generally assumed that the plasma density (electron) is proportional to the square of the electrode voltage. Therefore, a range of 2-4% in plasma deviation means 1-2% of voltage deviation (half of the plasma deviation value). It should be emphasized that plasma-processing homogeneity is not only given by the plasma homogeneity (electron and ions) since the chemical equilibrium in the reactor can highly contribute to the thin film processing homogeneity. Nonetheless, it is a requirement in the design of the plasma processing apparatus to have at least uniform (homogenous) plasma over the whole surface where the process occurs.

In terms of r×f, this threshold is in the range of 5 m·MHz (or $5 \times 10^6$ m·Hz). This example corresponds to a frequency of 13.6 MHz and a reactor (electrode) size (radius or half diagonal) of 0.5 m.

On the other hand there is an upper limit for "r×f", where the technology described hereunder finds its limitations. This upper limit is in the range of 50 m·MHz (or $5 \times 10^7$ m·Hz). Furthermore there is also an upper limit for the excitation frequency, which today is in the range of 2500 MHz.

A vacuum treatment apparatus according to the invention therefore comprises a vacuum vessel, at least two electrodes defining an internal process space and at least one power supply connectable with said electrodes. A substrate holder for a substrate to be treated is provided for in the internal process space and gas inlet means, e.g. according to the shower head principle. At least one of said electrodes has along a first cross section a concave profile and has along a second section a convex profile, the first cross section being parallel to the second cross section. This can be found described in detail in the section below and with aid of some figures.

In one embodiment two of said electrodes in the vessel each have along a first cross section a concave profile and along a second section a convex profile, the first cross section being parallel to the second cross section. Advantageously these electrodes may be machined to be shaped equally. The power supply may be a radiofrequency power supply for frequencies of 13.56 MHz or higher, which in a preferred embodiment is connectable with at least one of these electrodes at least two connection points. The space between said substrate and one of the electrodes can according to a further embodiment of the invention be at least partially furnished with a corrective dielectric layer, which can (further embodiment) complement the shape of the electrode and be adapted to hold the substrate.

In order to make use of the invention a method for treating at least one flat substrate in such a vacuum treatment apparatus will comprise the steps of introducing said substrate in the internal process space, providing gas to the internal process space via gas inlet means, applying power to the internal process space via said electrodes and treating said substrate, whereby comprises e.g. heating, coating or etching.

DESCRIPTION OF THE DRAWINGS

FIG. 1-b: Plasma light intensity distribution over reactor diameter for 100 MHz excitation frequency for various plasma discharge conditions at pressure levels between 10 and 500 mbar (in the PECVD range) and prior art flat electrodes. Note the shift in position of the minimum light intensity between 67.8 MHz (about 450 mm in FIG. 2-a) and 100 MHz (about 300 mm in FIG. 2-b).

FIGS. 2-a, 2-b, and 2-c: Plasma Ion flux (Ji) uniformity profile for 0.4 m×0.4 m reactor measured by electrical probes (64=8×8 probes) for 3 different excitation frequencies. 2a: plasma ignited at 13.6 MHz, 2b: plasma ignited at 60 MHz, and 2c: plasma ignited at 81.4 MHz.

FIG. 3-*b*: 3-D shape of the electrode according to the invention. The CDL is the complementary part of the electrode (i.e. the "negative" of the electrode).

FIG. 3-*c*: when moving along a line from F to C in FIG. 3-*b*, the surface of the electrode has a generally convex shape (in AFD), which gradually changes to become concave (in ECH). The same is true for all corresponding movements form the half-length points (E, F, G, H) towards the center C. In FIG. 3-*c* it can also be seen that the electrode is thickest in E and H, thinner again in F and G, thinner again in A, B, and D and thinnest in C.

FIG. 3-*d*: another view of the electrode shape.

FIG. 3-*e*: shows the difference between the electrode shape of prior art (light gray) and the present invention (dark grey). The Gaussian curve of US '438 intersects with the edges to a concave curve and not to a convex one as in the present invention. Thereby the plasma non-uniformity is not compensated for in the corners of the reactor.

SOLUTION ACCORDING TO THE INVENTION

The present invention introduces a compensation scheme for the standing wave problem in rectangular or square reactors. This compensation is based on a Compensating Dielectric Layer (hereinafter CDL or "Lens"). The CDL layer can be of any dielectric material including vacuum, gas, liquids or solids. The CDL has a flat planar surface towards the plasma side and it has a complexly curved surface towards the electrode side.

Figure 1:
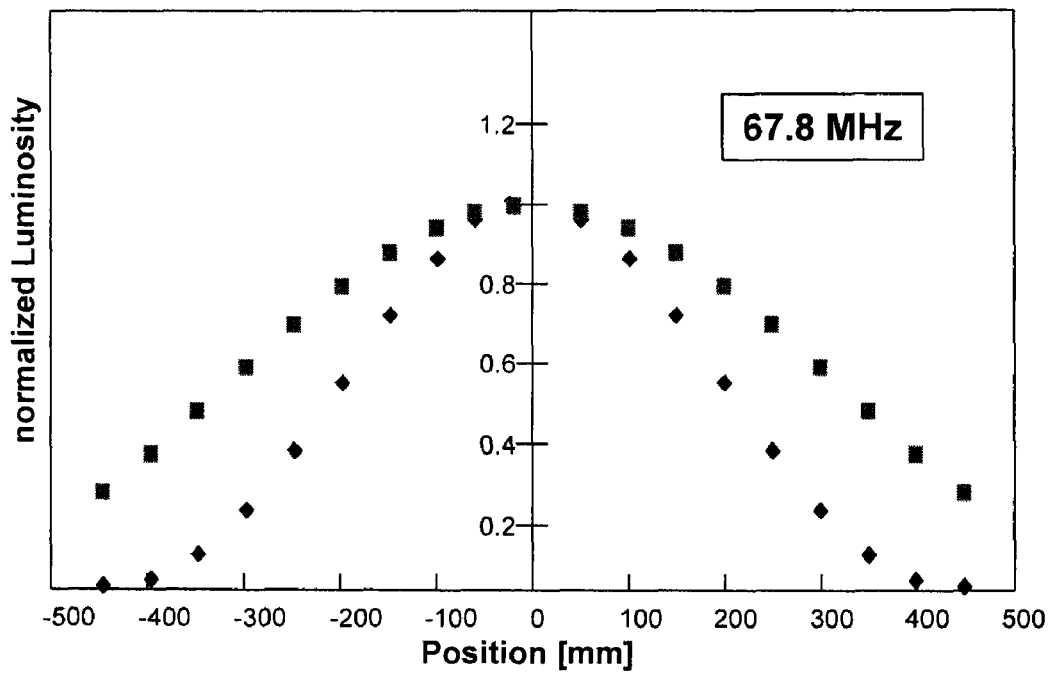
FIG. 1-a: Plasma light intensity distribution over reactor diameter for 67.8 MHz excitation frequency for two extreme Argon plasma conditions. All other conditions lead to a light intensity distribution in-between these two curves. The plasma density variations induced by the standing wave effect is clear as it leads to a nearly zero density plasma for radius=400 mm at 67.8 MHz. In the experimental conditions and without plasma, the decrease to zero is predicted to be at r=2400 mm. This means that the presence of the plasma amplifies the standing wave effect, leading to a decrease of the field at a much smaller radius (r~450 mm).
Figure 1:
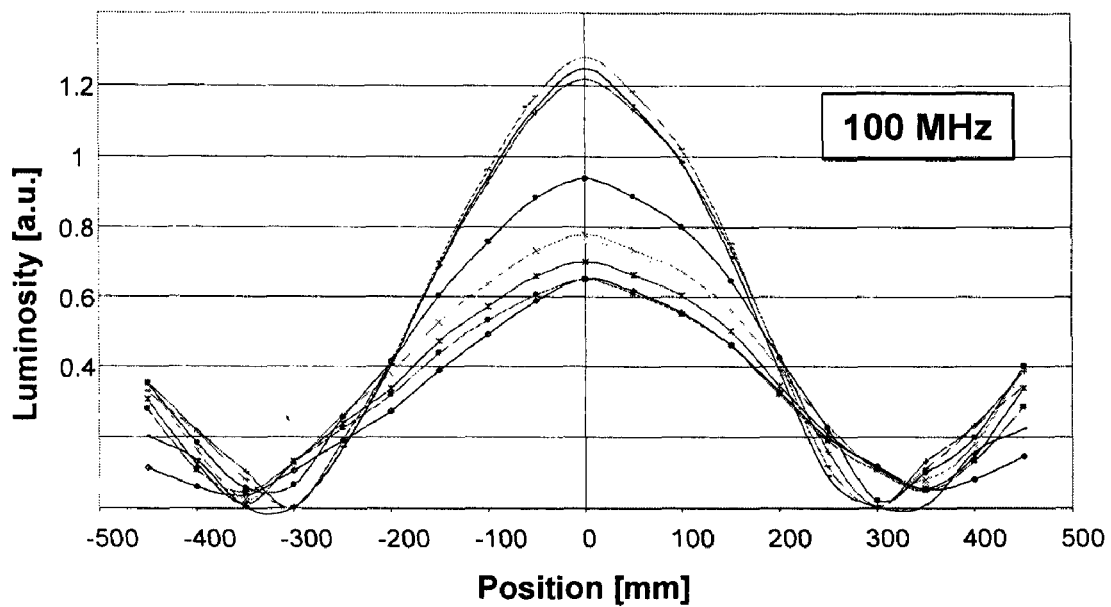
Figure 3:
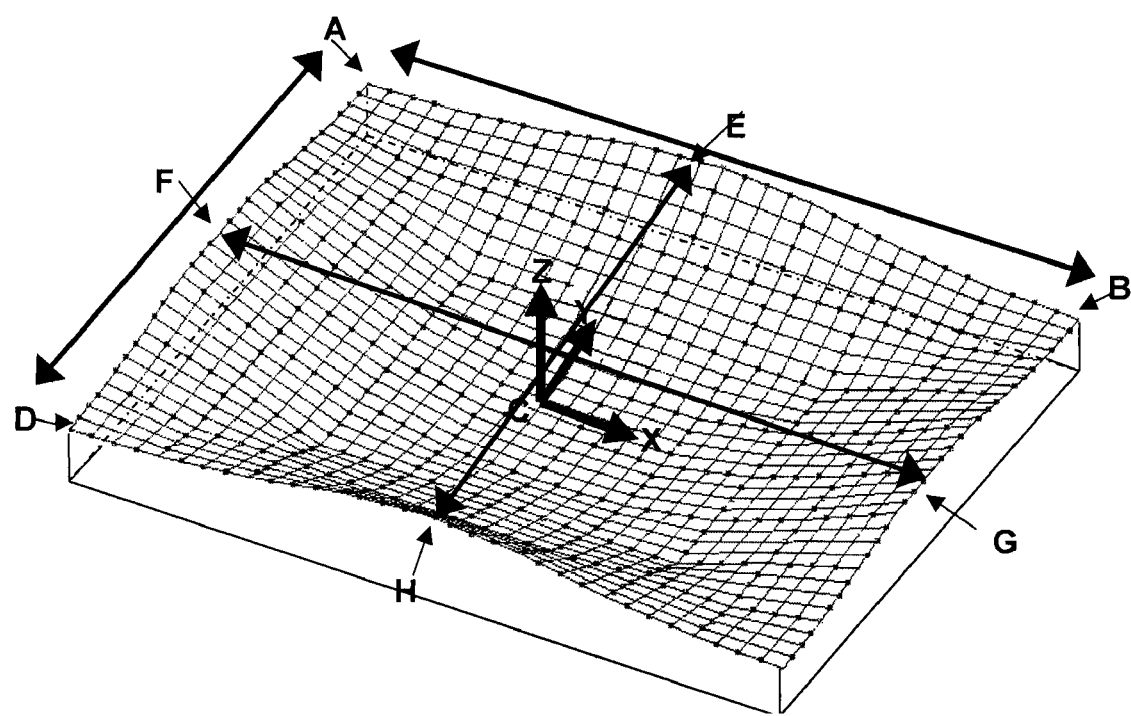
FIG. 3-a: 3-D shape of the electrode for a rectangular reactor. The glass is positioned on the CDL. The CDL is then between the glass and the electrode. Note that the minimum CDL thickness can be larger than zero, which means that the glass substrate does not necessarily lie directly on the electrode.
Figure 3:
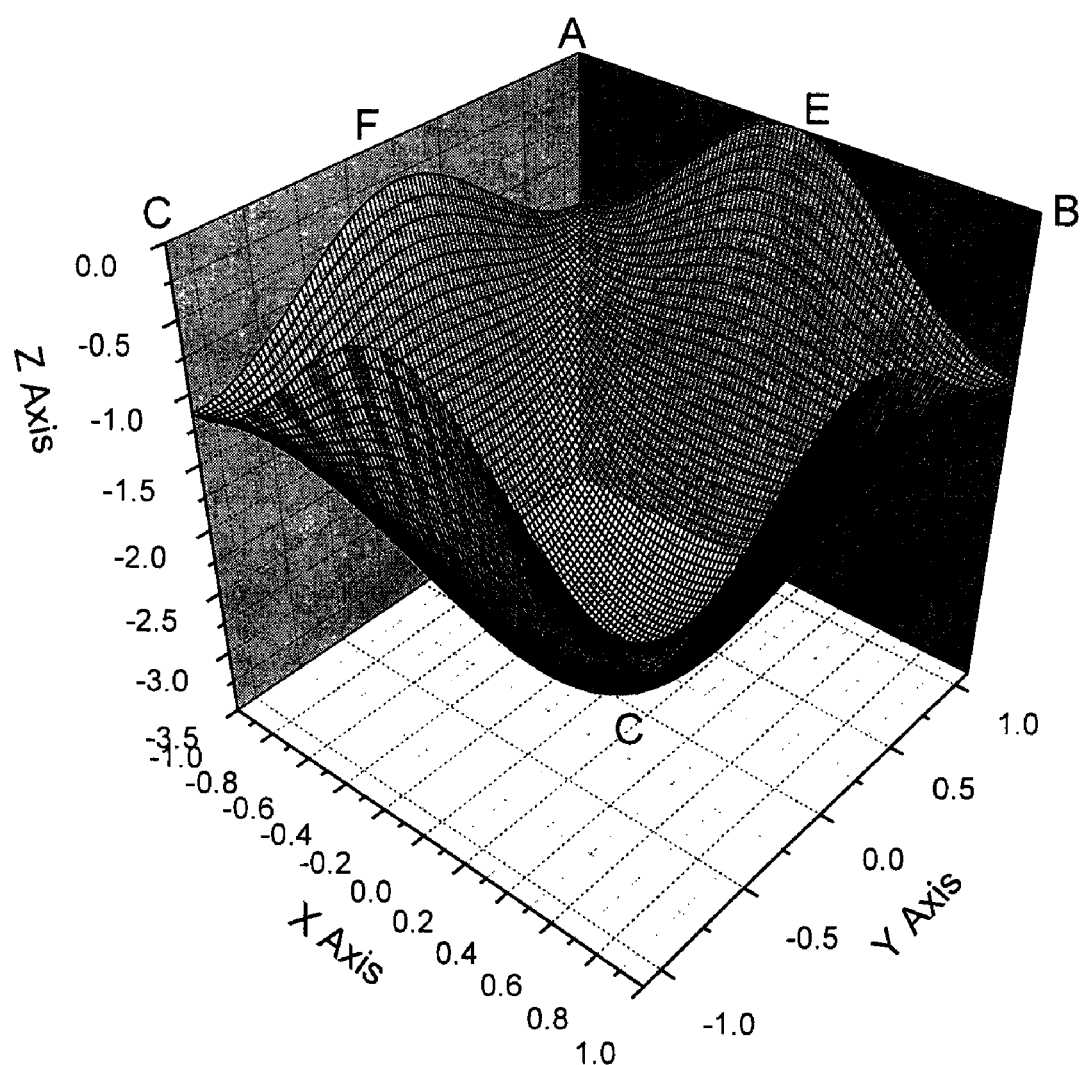
Figure 3:
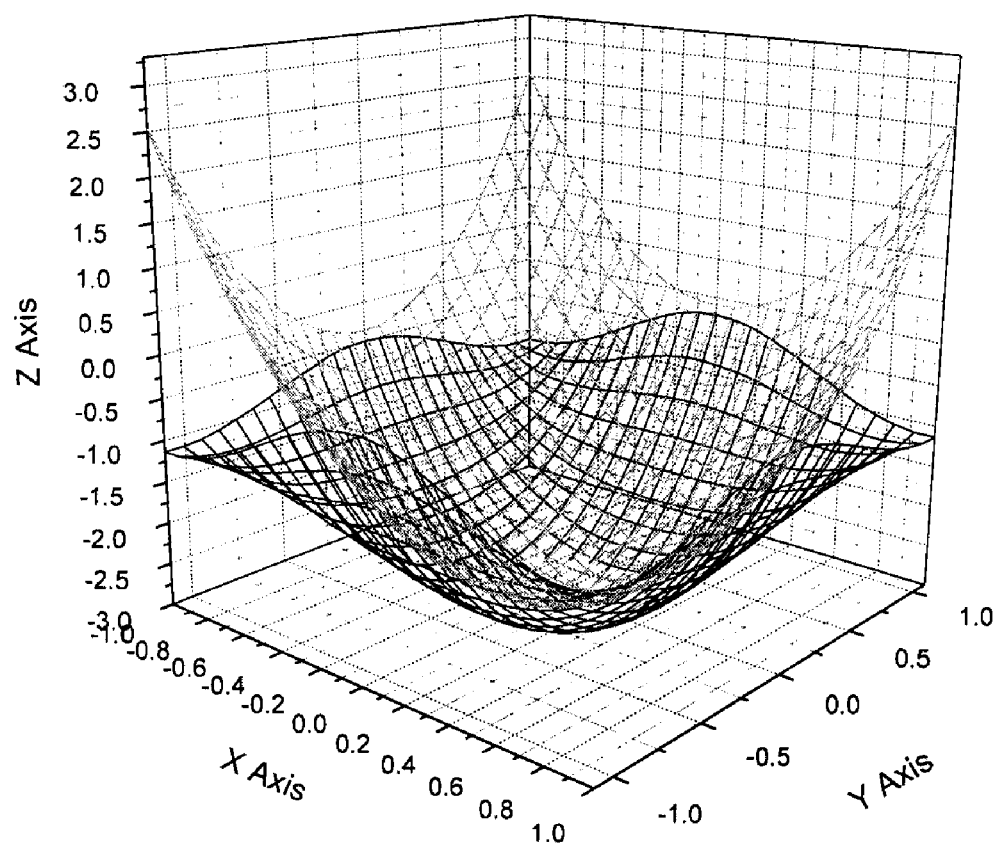

If this complexly curved surface of the CDL is considered geometrically positive, the surface of the electrode forms the corresponding geometrical negative (FIG. 3-*a*). In order to accommodate the CDL layer of the present invention, the electrode must be shaped accordingly. In the following, the curved surface of the electrode (which is essentially the same but inverted surface as the CDL) shall be described.

In opposition to the rather smooth, concave and regularly shaped lens valid for cylindrically symmetric reactor (as described in US. '438), we have found that the best design for a compensation length in rectangular geometry is not as simple. We describe this optimal geometry below.

As a reference, a plane of maximum electrode thickness is introduced which goes through points E and H in FIG. 3-*b* and lies in parallel to the XY plane. Depending on which dielectric material is being used, this does not mean that the CDL thickness is zero at points H and E. (FIGS. 3-*a*, 3-*b*, and 3-*d*). In FIG. 3-*b*, four electrode thickness profiles are described: sections AFD and ECH are parallel to the YZ plane (the shorter dimension) and sections AEB and FCG are in the XZ plane (the longer dimension). C lies in the center of the electrode and E, F, G and H each describe the half-lengths in their respective dimensions.

The thickness of the CDL and thus the decrease from the maximum electrode thickness is largest in the centre of the electrode (point C) and the electrode is thinnest in C accordingly.

The electrode is thickest in E and H (the half lengths of the longer dimension). The thickness of the electrode thus decreases successively from E&H to F&G to A&B&D to C.

FIG. 3-*c* further describes the necessary shape of the rectangular electrode to accommodate the CDL: when moving along a line from F to C, the surface of the electrode has a generally convex shape (in AFD), which gradually changes to become concave (in ECH). The same is true for all corresponding movements form the half-length points (E, F, G, H) towards the center C. In FIG. 3-*c* it can also be seen that the electrode is thickest in E and H, thinner again in F and G, thinner again in A, B, and D and thinnest in C.

For a square reactor, where CF is of equal length than CE, and AD is of equal length than AB, it can easily be concluded that the electrode thickness is equal in E, F, G and H and larger than in A, B and D.

Typical CDL dimensions could be:

From 0 to 5 m in X, Y dimension (length, width).

Typically several millimeters in Z dimension (but may also be up several centimeters with large devices and high frequencies).

A numerical example is shown in FIG. 3-*c*: AB=2.2 m, AD=2 m, the maximum gap ($d_{max}$) is in the range of 3.2 mm for a CDL made only with vacuum and an excitation frequency of 27 MHz.

FIG. 3-*e* shows the difference between simple adaptation of prior art (US '438) and the present invention: the shape of the CDL is by no means an adaptation of a Gaussian curve (light gray) to a rectangular electrode, but according to the present invention a carefully designed shape (black) which takes special measures to compensate for plasma non-uniformity in the corners of a rectangular reactor.

Embodiments of the Invention

The present invention focuses on a solution with a compensated bottom electrode and using vacuum (or gas) as a dielectric. Other embodiments for the dielectric compensation can also be used, as well as different variants for the reactor configuration:

Two reactor configurations can be used: I) the CDL can be used for the bottom electrode which commonly is used as a substrate holder, II) the CDL can be used in the top electrode which is commonly used as a so called gas shower head for plasma processing purposes (PECVD, PVD, Etching and other such processes).

It can be useful to add the case with a lens on both electrodes. In that case, each lens thickness would be half the thickness of a lens in a single electrode. This case can also offer some advantage in terms of symmetry of the reactor (both electrodes are the same). It also permits to decrease the amplitude of the radial component of the electric field, which is a consequence of the electrode shape. This radial electric field may be the limiting factor in terms of uniformity when the lens becomes thick or when the plasma becomes very conductive (high density plasma at low pressure).

Also, two main CDL embodiments can be used: I) the dielectric can be vacuum or gas (with a relative dielectric constant $\in_r$ near to 1), or II) it can be filled with an appropriate dielectric material (with $\in_r$ larger than 1) such as alumina, zirconia, quartz or any other material which fulfills the thermal and chemical compatibility specifications of the targeted processing.

Figure 4:
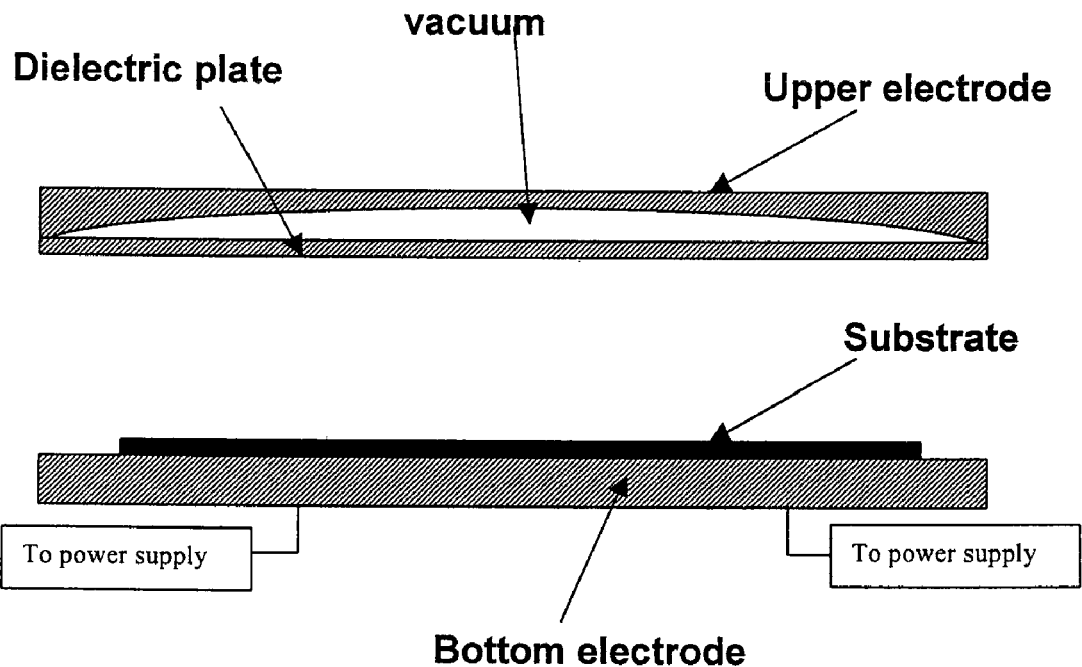
FIG. 4: variant 1 for a reactor and a compensation configuration.

By combining the above-mentioned variants, one can in summary end with four main embodiments:

Variant 1 (FIG. 4): the CDL is placed in or on the top electrode, and vacuum is used as main dielectric. In this case, a dielectric plate can be used on the top electrode in order to maintain plasma with a uniform gap (plasma thickness in z-axis). The process gas is flowing from the upper electrode through a given distribution means (shower head) and then flows through the dielectric plate where appropriate holes are distributed to let the gas pass towards the plasma zone.

Figure 5:
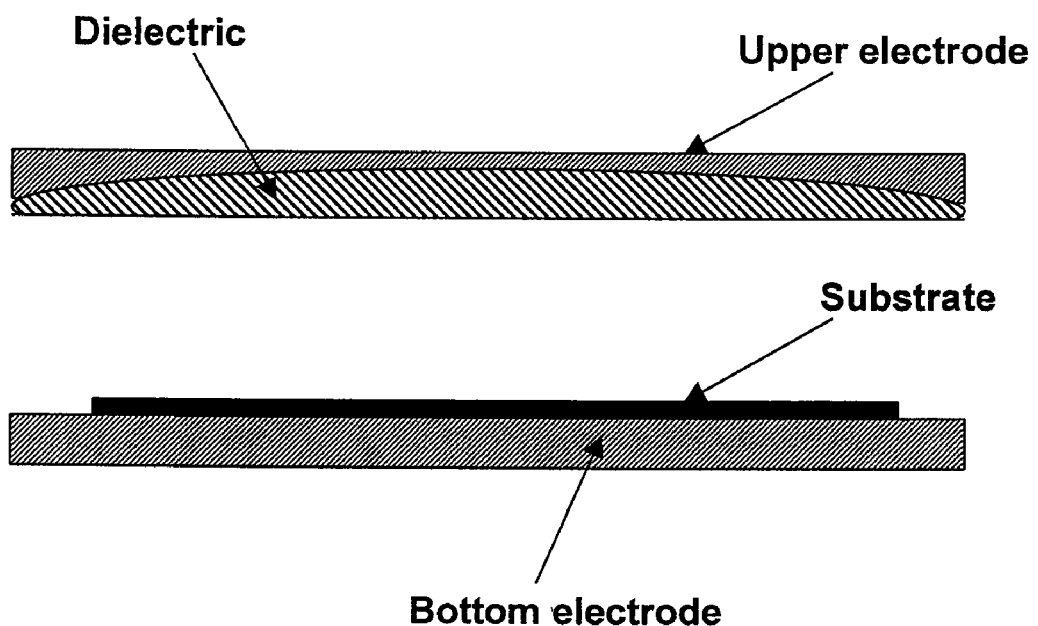
FIG. 5: variant 2 for a reactor and a compensation configuration.

Variant 2 (FIG. 5): the CDL is placed in or on the top electrode and a dielectric material (with $\in_r>1$) is used. This dielectric material can be porous to let the gas pass through to the plasma zone or a distribution of holes can be machined into it for the same purpose.

Variant 3 (FIG. 6): the CDL is placed in the region of the bottom electrode. Vacuum is used as a dielectric and the substrate is used as a way to maintain the plasma gap constant across the whole reactor volume. The substrate commonly is held over the dielectric and rests on pins distributed such that they keep the substrate in a substantially flat position. In order to adequately support the substrate, a supporting pin distribution with pin-to-pin distances in the range of 100 mm is preferred to maintain the flatness of a glass substrate of typically 0.7 mm thickness at temperatures of about 300° C. The supporting pins are designed to have as little influence on the behavior of the plasma as possible, since this leads to a direct perturbation on the film being processed on the substrate, effecting local defects of the film (thickness, electrical properties). Its has been found that using thin (slim) supporting pins (with typically r<2 mm) can reduce this influence to a level of <2%. (See also DE10134513 A1)

Figure 7:
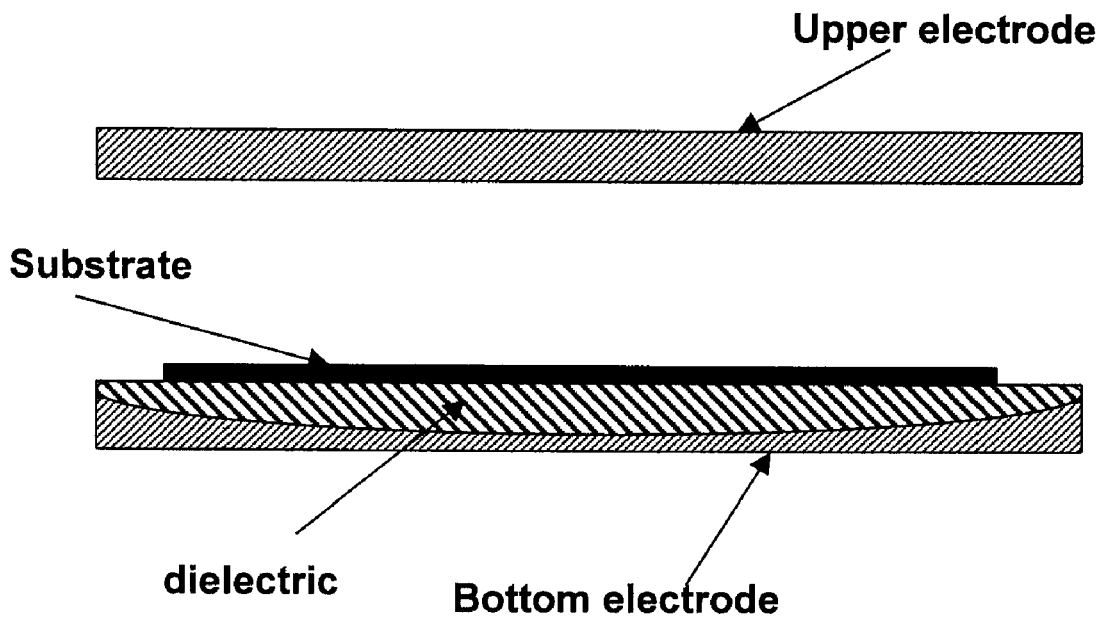
FIG. 7: variant 4 for a reactor and a compensation configuration

Variant 4 (FIG. 7): the CDL is shaped in or on the bottom electrode and a dielectric material (with $\in_r>1$) is used.

Variant 5: the CDL is shaped in or on the bottom electrode and a combination of dielectric materials ($\in_r=1$ and $\in_r>1$) is used.

As is obvious to those skilled in the art, almost all of these variants can again be combined with one another.

Since the shape of the CDL is rather complex, the same holds also for the electrode, which accommodates the CDL. In practice, it is possible to machine the electrode, which will contain the CDL and/or the dielectric material of the CDL using an approximation of more simple steps of a given height in order to save machining cost. The number of steps necessary to correctly define the electrode shape is given by the fact that these steps shall not influence the plasma process. In PECVD, the practical step height shall not exceed 0.1 mm. Accordingly for a 3 mm CDL; one should machine at least 30 steps of 0.1 mm height.

In fact we can be more general for the number of steps. We can estimate the number of steps needed in terms of the desired uniformity. If Uflat is the electric field uniformity for the flat electrode case, then an estimation of the uniformity for n steps is given by Uflat/(nsteps+1) i.e. if Uflat=10% then 9 steps give a 1% uniformity.

Figure 8:
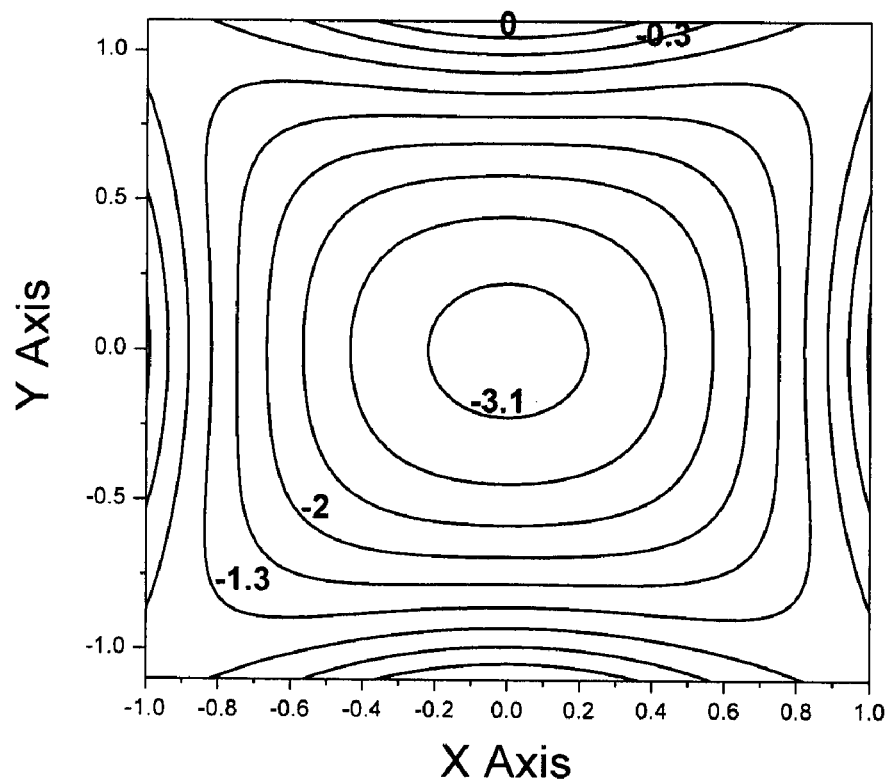
FIG. 8*a*: contour line of the CDL shape (top view). These contour lines describe how the electrode is to be machined.
FIG. 8*b*: side view of the CDL and electrode assembly. The number of steps is chosen to minimize the difference between the ideal shape and the approximated step shape and machining cost.
Figure 8:
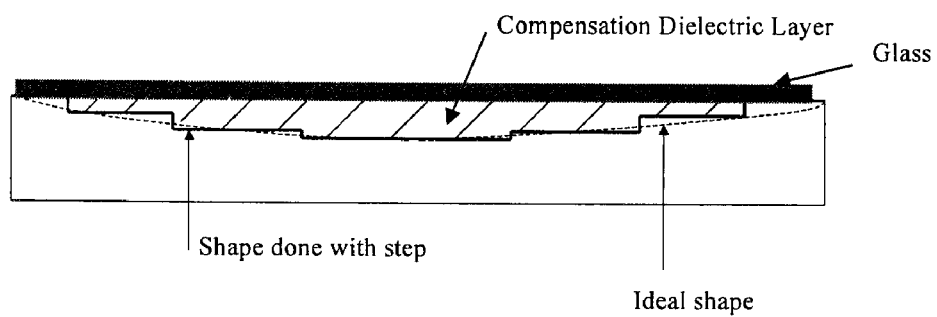

In FIG. 8-$a$, an example of contour lines is presented. These contour lines can be used to define the position of the steps to be machined. It is thus possible to simplify the manufacturing. A corresponding cross section is presented in FIG. 8-$b$.

Further Advantages of the Invention

The CDL layer and the corresponding electrode according to the invention can also be used for other processes, which do not necessarily imply plasma. It can be used for chambers that utilize electromagnetic waves for heating (or for drying). In such an application, the process could be heating and the compensation of electric field non-uniformity by the CDL will help to achieve uniform temperature distribution.

By achieving a uniform plasma density with the present invention, a very critical parameter for layers used in LCD, plasma display or semiconductor applications is the so-called wet-etch rate uniformity, which closely corresponds with the stoichiometry of a layer: the present invention leads to a far more uniform wet etch rate of layers across the substrate area, therefore allowing for a reduction of the total layer thickness and thus saving cost in the PECVD deposition as well as in the dry or wet etching process.

By obtaining a more uniform plasma distribution, the present invention allows for a whole string of advantages which are a consequence of increased layer uniformity and layer thickness uniformity: a higher doping uniformity of semi conducting layers across the substrate area can be achieved. For example in LCD technology, more uniform layers are etched more evenly which can be an advantage for back channel etch optimization and thus leads to thinner doped layers, thinner HDR layers, shorter etching times, better mobility, and generally lower production cost.

Figure 6:
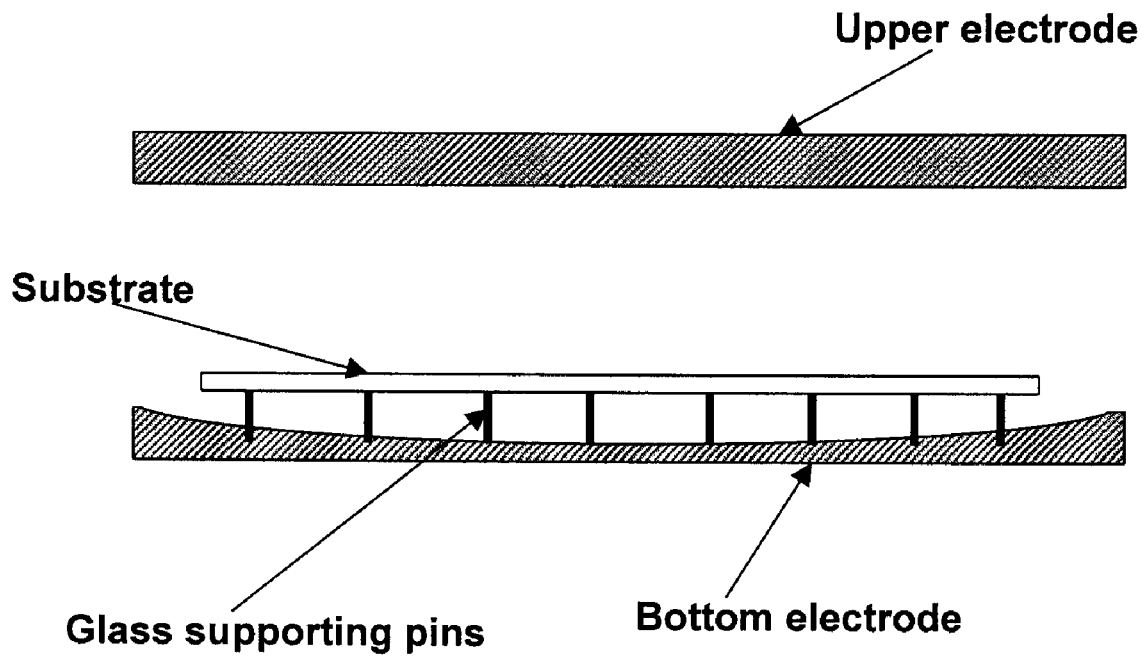
FIG. 6: variant 3 for a reactor and a compensation configuration. In this case, it is important, that the substrate makes contact with the metallic part of the electrode; otherwise the plasma will fill the space in between and destroy the compensation effect. The drawing exaggerates the distance at the edge.

In addition, a critical problem in PECVD processes is the presence and arrangement of pins that are used to lift up the substrate from the bottom electrode, the transport pins as opposed to the supporting pins mentioned above. These transport pins lift the substrate at different stages of the process (for example during loading and unloading of the substrate) and thus need to be designed robustly so that they will not break. The presence of those transport pins in standard reactors is likely to cause film growth perturbation (by temperature non-uniformity, electrostatic field perturbation) resulting in a non-uniform etch rate. This effect is particularly disturbing, if the pin is located in or near the active area of a device, for example in the active area of a LCD TFT array. With this invention, the dielectric lens below the substrate greatly reduces the impact of the transport pin perturbation. The present invention thus allows the use of pins with larger diameters for the implementation of more robust pin designs. It shall be underlined that static supporting pins (as shown in FIG. 6) can be made small enough to reduce the process perturbation to a non-significant level.

The invention claimed is:

1. An electrode for use in a vacuum treatment apparatus for treating a substrate, said electrode having a surface with peripheral edges that define a rectangular or square shape when viewed from above, said surface having a generally convex profile along a respective edge cross section taken along each said peripheral edge, which profile gradually changes on approaching the center of said electrode to become a concave profile along a center cross section that is parallel to the respective edge cross section and is taken through the center of said surface.

2. An electrode according to claim 1, said surface being machined as a plurality of steps, which together provide a contour of said surface that conforms to the respective convex and concave profiles in claim 1.

3. An electrode according to claim 2, each of said plurality of steps having a step height that does not exceed 0.1 mm.

4. A vacuum treatment apparatus for treating a substrate, comprising at least two electrodes as set forth in claim 1, said at least two electrodes defining a process space.

5. A vacuum treatment apparatus according to claim 4, wherein said at least two electrodes are shaped equally.

6. A vacuum treatment apparatus according to claim 4, further comprising a radiofrequency power supply capable to supply frequencies of 13.56 MHz or higher connected with said electrode.

7. A vacuum treatment apparatus according to claim 4, wherein at least one of said electrodes is connectable with a power supply at least two connection points.

8. A vacuum treatment apparatus according to claim 4, further comprising a substrate positioned in said process space, wherein a space between said substrate and at least one of said electrodes is at least partially furnished with a corrective dielectric layer.

9. A vacuum treatment apparatus according to claim 8, wherein one surface of the corrective dielectric layer complements the shape of said surface of said electrode.

10. A vacuum treatment apparatus according to claim 8, wherein one surface of the corrective dielectric layer is adapted to hold the substrate.

11. A vacuum treatment apparatus according to claim 8, wherein the corrective dielectric layer comprises vacuum, gas, alumina, zirconia or quartz.

12. A vacuum treatment apparatus according to claim 8, further comprising a gas inlet system comprising a set of holes in said electrode to provide gases to said process space.

* * * * *